(12) United States Patent
Cazzaniga et al.

(10) Patent No.: US 8,912,856 B2
(45) Date of Patent: Dec. 16, 2014

(54) ELECTRO-MECHANICAL RESONANCE LOOP

(71) Applicant: Maxim Integrated Products, Inc., San Jose, CA (US)

(72) Inventors: Gabriele Cazzaniga, Rosate (IT); Federico Forte, Novara (IT); Luciano Prandi, Bellinzago Novarese (IT)

(73) Assignee: Maxim Integrated Products, Inc., San Jose, CA (US)

( * ) Notice: Subject to any disclaimer, the term of this patent is extended or adjusted under 35 U.S.C. 154(b) by 66 days.

(21) Appl. No.: 13/736,591

(22) Filed: Jan. 8, 2013

(65) Prior Publication Data

US 2014/0300425 A1    Oct. 9, 2014

(51) Int. Cl.
| | |
|---|---|
| *H03B 5/30* | (2006.01) |
| *G01C 19/56* | (2012.01) |
| *G01P 15/097* | (2006.01) |
| *G01P 15/14* | (2013.01) |
| *G01C 19/567* | (2012.01) |
| *G01C 19/5726* | (2012.01) |
| *G01C 19/5649* | (2012.01) |

(52) U.S. Cl.
CPC ............... *H03B 5/30* (2013.01); *G01C 19/567* (2013.01); *G01P 15/14* (2013.01); *G01P 15/097* (2013.01); *G01C 19/5726* (2013.01); *G01C 19/5649* (2013.01)
USPC ........ 331/154; 73/503.3; 73/504.4; 73/504.12

(58) Field of Classification Search
CPC ............... G01C 19/56; G01C 19/5642; G01C 19/5649; G01C 19/567; G01C 19/5677; G01C 19/5684; G01C 19/5691; G01C 19/5719; G01C 19/5726; G01C 19/5776; G01P 9/04; G01P 15/08; G01P 15/097; G01P 15/125; G01P 15/14; G01P 15/18; H03B 5/30; H03H 3/04; H03H 3/0072; H03H 9/2463; H03H 9/542; H03H 9/545; H03H 2009/02496
USPC ................. 73/503.3, 504.02–504.04, 504.12, 73/504.14, 504.15; 331/154; 333/186, 188
See application file for complete search history.

(56) References Cited

U.S. PATENT DOCUMENTS

| | | | | |
|---|---|---|---|---|
| 5,598,158 | A | * | 1/1997 | Linz ............................... 341/143 |
| 5,992,233 | A | * | 11/1999 | Clark .......................... 73/514.35 |
| 6,564,637 | B1 | * | 5/2003 | Schalk et al. .............. 73/504.12 |
| 6,651,499 | B2 | * | 11/2003 | Fell et al. ................... 73/504.12 |
| 6,934,665 | B2 | * | 8/2005 | Rober ........................... 702/189 |
| 7,159,461 | B2 | * | 1/2007 | Gallon et al. .............. 73/504.12 |

(Continued)

*Primary Examiner* — Levi Gannon
(74) *Attorney, Agent, or Firm* — North Weber & Baugh LLP

(57) ABSTRACT

The invention relates to a controller, and more particularly, to systems, devices and methods of controlling a sensor having a resonating mass. The controller includes: an analog-to-digital converter (ADC) unit for extracting a digitized sensor signal from the sensor signal; a phase controller for generating, based on the digitized sensor signal, a phase-controlled signal that is locked in phase with the digitized sensor signal; an amplitude controller for applying a gain to the digitized sensor signal to thereby generate an amplitude-adjusted signal; a modulator for modulating the amplitude-adjusted signal to thereby generate a modulated signal; and a phase shifter for shifting the phase of the modulated signal by 90 degrees. The output signal from the phase shifter is amplified and input to the drive for exciting the resonating mass, to thereby form a closed resonance loop for controlling the oscillation amplitude of the resonating mass.

19 Claims, 3 Drawing Sheets

(56) References Cited

U.S. PATENT DOCUMENTS

| | | | |
|---|---|---|---|
| 7,240,533 B2* | 7/2007 | Fell et al. | 73/1.38 |
| 7,805,993 B2* | 10/2010 | Spahlinger | 73/504.02 |
| 7,980,134 B2* | 7/2011 | Hammerschmidt | 73/504.12 |
| 8,183,944 B2* | 5/2012 | Seeger et al. | 331/154 |
| 8,347,718 B2* | 1/2013 | Malvern et al. | 73/504.13 |
| 8,578,775 B2* | 11/2013 | Hayner et al. | 73/504.12 |
| 2012/0111111 A1* | 5/2012 | Murakami et al. | 73/504.12 |

* cited by examiner

ELECTRO-MECHANICAL RESONANCE LOOP

BACKGROUND

A. Technical Field

The present invention relates to a sensor controller, and more particularly, to a controller having a closed loop to control the oscillation amplitude of a resonating mass in a sensor.

B. Background of the Invention

A rate of rotation sensor has been widely applied to measure the angular velocity of a moving object. FIG. 1 shows a schematic diagram 100 of a conventional gyroscope for measuring the rate of rotation of a sensor. As depicted, the conventional gyroscope includes: a sensor signal processor 114 for processing a sensor signal 106 from the sensor of a sensor unit 102; and a driver signal processor 112 for generating and providing a driver signal (or, equivalently, forcing signal or excitation signal) 108 to a driver of the sensor unit 102.

Such a conventional system has several problems. First, the excitation frequency, which is derived from the system clock, may not be close to the resonant frequency under certain circumstances, such as the start-up stage or transient stages caused by an external shock event. An error of a few percent in the system clock frequency, which is typically an integer multiple of the resonant frequency in the steady state only, from its target frequency can generate a very long start-up time or even make it impossible to start the sensor movement. As a consequence, the conventional system requires a factory calibration of the voltage-controlled oscillator (VCO) of the system clock.

Second, a conventional system is implemented mostly in analog domain, i.e., it uses more analog components than digital components. Since a large portion of the processes in the controller are based on analog functions, the conventional controller has low immunity to process spread, while it typically has a high form factor and a high power consumption rate.

Therefore, a better solution is needed to address the main issues, including long start-up time, low immunity to process spread, poor protection against external shock events, large form factor, and low efficiency in power consumption, of the conventional sensor controller.

SUMMARY OF THE INVENTION

Various embodiments of the present invention relate to a sensor controller, and more particularly, to systems, devices and methods of controlling the oscillation amplitude of a resonating mass in a sensor. The sensor controller provides reduction in the start-up time, high immunity to process spread, and enhanced rejection to external shock events.

One aspect of the invention is a controller that controls a sensor having a resonating mass. The controller includes: an analog-to-digital converter (ADC) unit for extracting a digitized sensor signal from the sensor displacement or velocity signal; a phase controller for generating, based on the digitized sensor signal, a phase-controlled signal that is locked in phase with the digitized sensor signal; an amplitude controller for applying a gain to the forcing signal; a modulator/phase-shifter for modulating the desired gain with a periodic waveform that has a preset phase shift with respect to the sensor signal. The preset phase shift can be 90 degrees in the case where the displacement signal is converted and 0 degree in the case where the velocity signal is converted. The output signal from the phase shifter is amplified and input to the drive for exciting the resonating mass, to thereby form a closed resonance loop for controlling the oscillation amplitude of the resonating mass.

Another aspect of the invention is a method of controlling a sensor having a resonating mass. The method includes: converting a sensor signal into a digital format to thereby generate a digitized sensor signal, the sensor signal indicating a displacement or a velocity of the resonating mass; controlling a phase of a system clock signal to thereby lock the digitized sensor signal to the system clock signal; adjusting an amplitude of the digitized sensor signal by applying a gain thereto; modulating the digitized sensor signal; shifting a phase of the modulated sensor signal by a predetermined angle; and, based on the phase-shifted sensor signal, generating a signal for driving the resonating mass.

Certain features and advantages of the present invention have been generally described in this summary section; however, additional features, advantages, and embodiments are presented herein or will be apparent to one of ordinary skill in the art in view of the drawings, specification, and claims hereof. Accordingly, it should be understood that the scope of the invention shall not be limited by the particular embodiments disclosed in this summary section.

BRIEF DESCRIPTION OF THE DRAWINGS

References will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments.

DETAILED DESCRIPTION OF THE PREFERRED EMBODIMENTS

In the following description, for the purposes of explanation, specific details are set forth in order to provide an understanding of the invention. It will be apparent, however, to one skilled in the art that the invention can be practiced without these details. One skilled in the art will recognize that embodiments of the present invention, described below, may be performed in a variety of ways and using a variety of means. Those skilled in the art will also recognize additional modifications, applications, and embodiments are within the scope thereof, as are additional fields in which the invention may provide utility. Accordingly, the embodiments described below are illustrative of specific embodiments of the invention and are meant to avoid obscuring the invention.

A reference in the specification to "one embodiment" or "an embodiment" means that a particular feature, structure, characteristic, or function described in connection with the embodiment is included in at least one embodiment of the invention. The appearance of the phrase "in one embodiment," "in an embodiment," or the like in various places in the specification are not necessarily all referring to the same embodiment.

Furthermore, connections between components or between method steps in the figures are not restricted to connections that are effected directly. Instead, connections illustrated in the figures between components or method steps may be modified or otherwise changed through the addition thereto of intermediary components or method steps, without departing from the teachings of the present invention.

Various embodiments of the invention relate to a sensor controller, and more particularly, to systems, devices and methods of controlling the oscillation amplitude of a resonating mass by implementing an electro-mechanical resonance loop in the controller. The resonating mass displacement is sensed through a capacitance variation at the sensing electrodes. The readout signal from the sensing electrodes is converted into a digital signal and the digitized signal is input to two controllers: a phase controller and an amplitude controller. The output from the phase controller is used to drive a voltage control oscillator (VCO) and guarantees that the entire system is locked in phase with the resonating mass movement. The output from the amplitude controller is modulated with a periodic waveform that is shifted in phase by 90 degrees in the case where the readout signal is a displacement signal is used and by 0 degrees in the case where the sensor signal is a velocity signal. The phase-shifted signal is used to drive the resonating mass so that the excitation force of the resonating mass is phase-shifted by 90 degrees relative to the movement of the resonating mass or 0 degrees relative to the velocity of the resonating mass.

Figure 1:
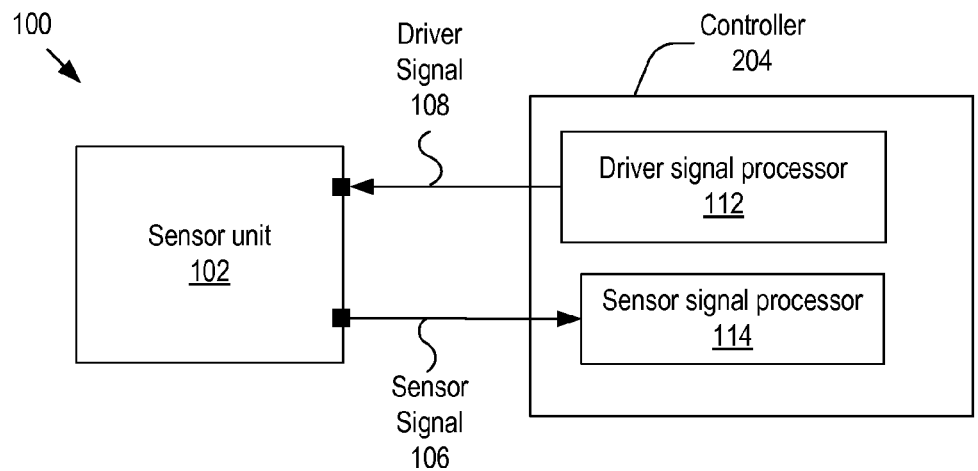
FIG. 1 illustrates a block diagram of a conventional gyroscope.
Figure 2:
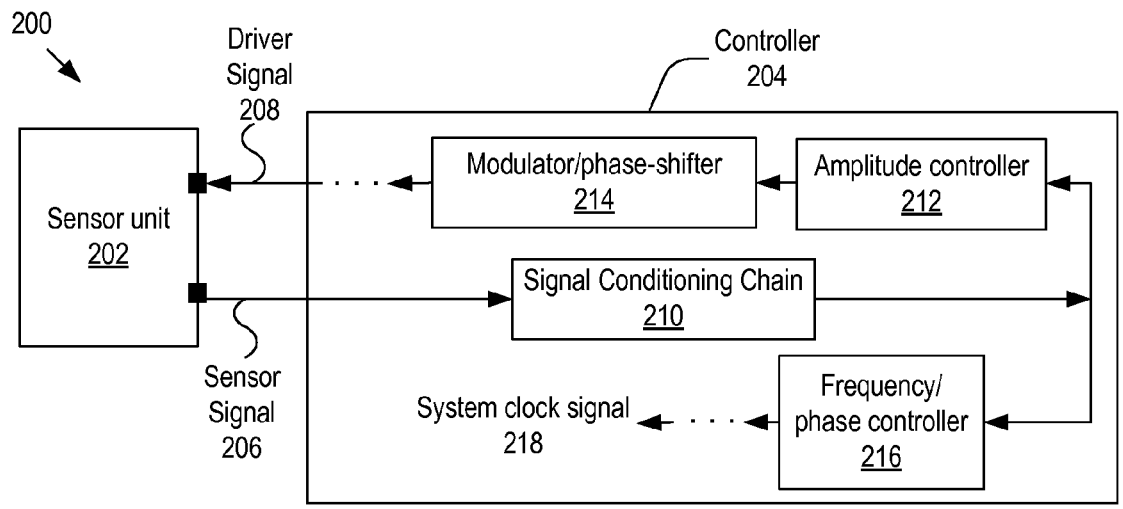
FIG. 2 illustrates an exemplary block diagram of a gyroscope for measuring a rate of rotation according to one embodiment of the present invention.

FIG. 2 illustrates an exemplary block diagram 200 of a gyroscope for measuring a rate of rotation according to one embodiment of the present invention. As depicted, gyroscope 200 includes: a sensor unit 202 having a sensor, a driver, and a resonating mass (not shown in FIG. 2); and a controller 204 for communicating a sensor signal 206 and a driver signal 208 to sensor unit 202. Sensor unit 202 is described in more detail below in conjunction with FIG. 3. The sensor generates sensor signal 206 in response to the displacement or velocity of the resonating mass and sensor signal 206 is input to controller 204, and more particularly, to an Signal Conditioning Chain 210. Sensor signal 206 can be any suitable type of electrical signal that is commensurate with the displacement of the resonating mass.

Signal Conditioning Chain 210 converts sensor signal 206 into a digital signal and processes the sensor signal to extract the displacement or velocity signal of the resonating mass therefrom, where the displacement signal (or, equivalently, movement signal) or velocity signal refers to the signal commensurate with the displacement or velocity of the resonating mass. Hereinafter, the terms "displacement signal" and "movement signal" are used interchangeably. Then, the movement signal is input to an amplitude controller 212 and a frequency/phase controller 216.

Frequency/phase controller 216 controls the frequency and phase of the movement or velocity signal and the output from frequency/phase controller 216 is used to drive a voltage control oscillator (VCO) and guarantee that the entire system is locked in phase with the resonating mass movement or velocity. Hereinafter, the term "lock in phase" refers to keep the phase difference between two signals at a constant value. As such, frequency/phase controller 216 guarantees that the operation of controller 204 is coordinated to the resonating mass movement.

One of the major functions of controller 204 is controlling the amplitude of the oscillation of the resonating mass. Here, amplitude controller 212 adjusts the amplitude of the movement signal by applying a gain to a periodic waveform, where the period of the periodic waveform is exactly the same as that of the resonating mass movement or velocity. Then, the output from amplitude controller 212 is input to a modulator/phase-shifter 214. Modulator/phase-shifter 214 modulates the gain and shifts the phase of the modulated signal by 90 degrees (or 0 degrees). Since the output from modulator/phase-shifter 214 is used to generate driver signal (or, equivalently, forcing signal or excitation signal) 208 for exciting the resonating mass, driver signal 208 is phase-shifted by 90 degrees (or 0 degrees) relative to sensor signal 206. Since driver signal 208 is in phase with the velocity of the resonating mass, the Barkhausen criterion of self-oscillation for resonating systems is satisfied.

Figure 3:
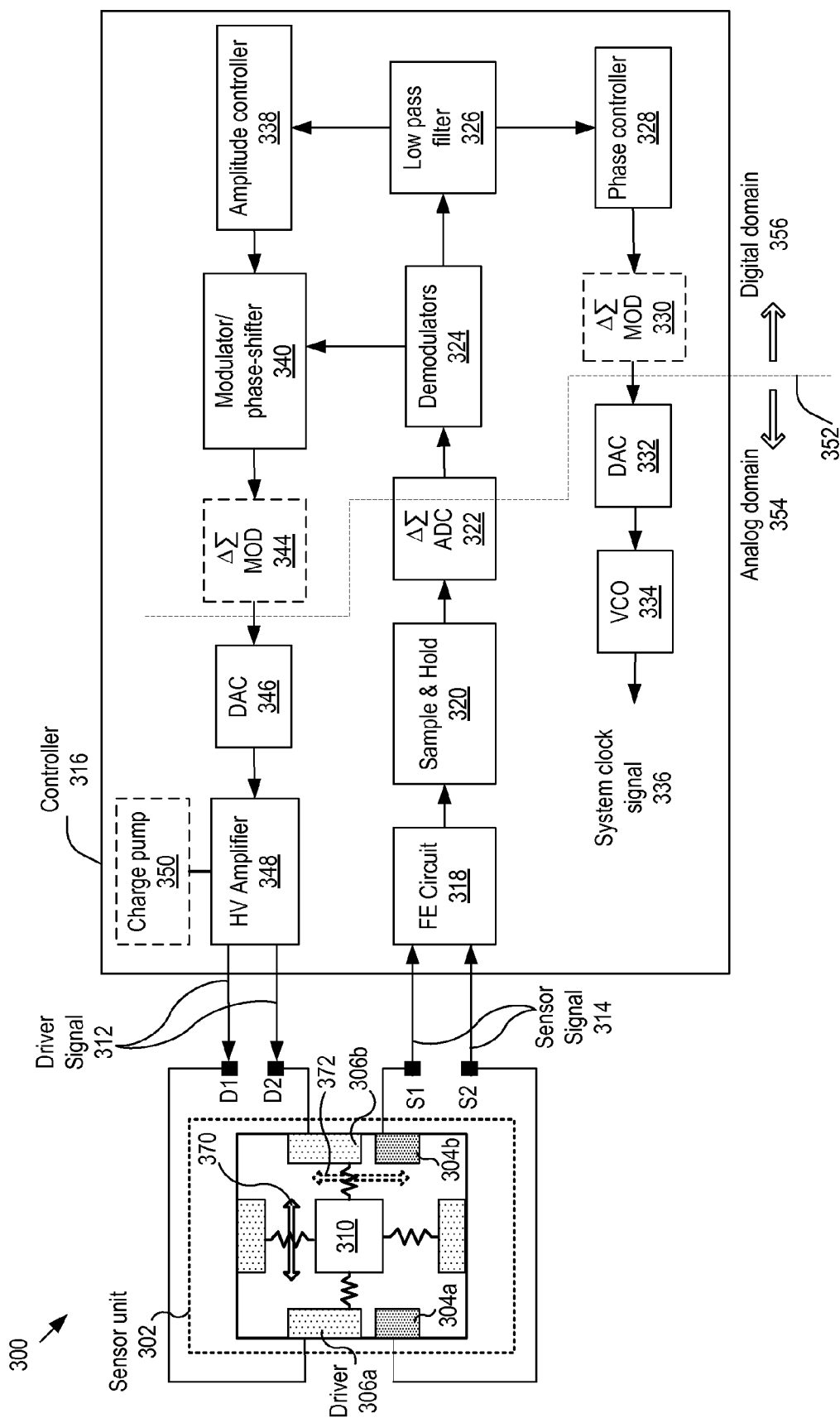
FIG. 3 illustrates a detailed block diagram of the gyroscope in FIG. 2.

FIG. 3 illustrates a detailed block diagram 300 of gyroscope 200 in FIG. 2. As depicted, sensor unit 302 includes: a resonating mass 310 suspended in space by two sets of springs; two sensor electrodes (or, shortly sensors) 304a and 304b; and two drive electrodes (or, shortly drivers) 306a and 306b. Sensor electrodes 304a and 304b may be capacitive electrodes that are responsive to the displacement of resonating mass 310 and operative to generate and output a sensor signal 314 through the two terminals S1 and S2. Drive electrodes 306a and 306b may be also capacitive electrodes that excite resonating mass 310 in response to a driver signal 312 received through the terminals D1 and D2.

It is noted that controller 316 is agnostic as to the sensor type; i.e., sensor unit 302 may be of any other suitable type and designed to measure other physical quantities as long as it has a resonating spring-mass system, at least one sensor, and at least one driver. As such, sensor electrodes 304a and 304b and drive electrodes 306a and 306b may be also of any other suitable type. For instance, sensor electrodes 304a and 304b may measure the displacement of resonating mass 310 through current variation instead of capacitance variation. It is further noted that sensor unit 302 may include more than one pair of sensor electrodes (and one pair of drive electrodes, even though only one pair of sensor electrodes 304a and 304b (and one pair of drive electrodes 306a and 306b) are shown in FIG. 3 for brevity.

To measure the rate of rotation of sensor unit 302, resonating mass 310 is oscillated along a double-headed arrow direction 370, for example, at the resonance frequency, $f_0$, by drive electrodes 306a and 306b. Resonating mass 310 is oscillated at the resonant frequency since the response of the spring-mass system to a driving force is peaked at the resonance frequency. When sensor unit 302 rotates along an axis normal to the paper, resonating mass 310 moves along an axis normal to a double-headed arrow direction 372 due to the Coriolis force, and this movement is detected by sensor electrodes 304a and 304b. In embodiments, another set of sensor electrodes may be used to measure the velocity of resonating mass 310. But, for the purpose of illustration, sensor electrodes 304a and 304b are assumed to measure the movement or velocity. In embodiments, resonating mass 310 may be excited to move in any direction when multiple sets of sensor electrodes measure the movement of resonating mass 310 in the three axes.

Controller 316 controls the oscillation amplitude of resonating mass 310 by using a closed electro-mechanical resonance loop implemented in controller 316. Controller 316 includes a front-end circuit (or, equivalently, front-end signal processor) 318 for converting the capacitance variation of sensor signal 314 into a voltage variation, where the capacitance variation is commensurate with the displacement or velocity variation of resonating mass 310. Front-end circuit 318 may be any suitable type of circuit, such as charge amplifier, that can process sensor signal 314. If sensor electrodes 304a and 304b generate current variation in response to the displacement or velocity variation of resonating mass 310, front-end circuit 318 may be a trans-impedance amplifier.

The output of front-end circuit 318 is an analog signal and input to a Sample & Hold 320. Sample & Hold 320 is a circuit that samples the voltage of a continuously varying analog signal, holds its value at a constant level for a specified minimal period of time, and releases the value as output signal. The output signal from Sample & Hold 320 is input to an analog-to-digital converter (ADC) 322, such as bandpass sigma-delta converter, for instance. It is noted that Sample & Hold 320 is needed since sensor signal 314 is subsequently converted from analog to digital signal format by analog-to-digital converter 322. The digitized sensor signal from $\Delta\Sigma$ ADC 322 is demodulated by a demodulators 324 so that the envelope of the amplitude of sensor signal 314 is extracted. For example, the digital signal may be demodulated through a digitally represented periodical waveform, such as sinusoidal waveform. The periodical waveform samples may be stored in a lookup table. The periodic waveform is a subharmonic of a system clock signal 336, i.e., the frequency, $f_p$, of the periodic waveform is expressed by an equation: $f_p=f_{vco}N$, where $f_{vco}$ is the frequency of the system clock and N is an integer number. In one embodiment, the data representing sensor signal 314 may be pre-stored in a lookup table and the signal processing is digitally performed by demodulators 324 to generate a read address required for reading out the data stored in the look-up table using a phase shift method. The output from the demodulators 324 may also include the phase error between the sensor signal and an internal clock reference.

The demodulated signal from demodulators 324 is input to a low pass filter 326 that filters noise in the demodulated signal.

The output of low pass filter 326 is used to control two quantities: the oscillation amplitude of resonating mass 310 and the phase of the system clock signal 336. In the steady state, the frequency of the system clock signal, $f_{vco}$, is an integer multiple of the resonance frequency $f_0$. However, in non-steady states, such as start-up stage or transient period caused by an external shock event, the frequency, $f_i$, derived from the system clock signal by an equation, $f_i=f_{vco}/N$, is different from the resonance frequency. Stated differently, the frequency of system clock signal 336 is not an integer multiple of the resonance frequency. During such non-steady states, system clock signal 336 needs to be locked in phase with sensor signal 314. It is because the operation of demodulator 324, as the other components of controller 316, is based on system clock signal 336 and, by locking system clock signal 336 in phase with sensor signal 314, the demodulated signal can accurately represent sensor signal 314.

To control the frequency of the system clock signal 336, phase controller 328 generates an output signal that is locked in phase with its input signal. As discussed below, the output signal of phase controller 328 is used to generate system clock signal 336. Thus, by locking the output signal to the input signal, phase controller 328 in effect locks the phase of sensor signal 314 to system clock signal 336, causing the operation of controller 316 to be coordinated in reference to sensor signal 314 during the non-steady states as well as steady state.

The output signal of phase controller 328 is input to a digital-to-analog converter (DAC) 332. Optionally, the output signal of phase controller 328 may be input to a sigma-delta digital modulator 330 before it is converted into digital format by DAC 332. The output signal of DAC 332 is used to drive a voltage-controlled oscillator (VCO) 334, where VCO 334 generates system clock signal 336.

Figure 4:
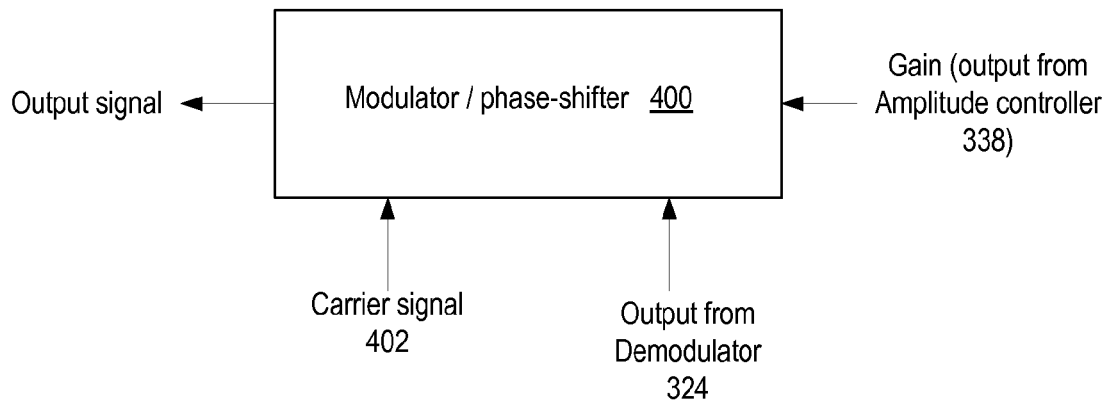
FIG. 4 illustrates an exemplary functional block diagram of a modulator/phase-shifter that might be used in the gyroscope of FIG. 3.

The output signal of low pass filter 326 is input to an amplitude controller 338. Amplitude controller 338 is used to apply a gain to the driving force signal to thereby control the amplitude or velocity of the oscillation of resonating mass 310. The gain, i.e., the output of amplitude controller 338, is input to a modulator/phase-shifter 340. FIG. 4 illustrates an exemplary functional block diagram 400 of the modulator/phase-shifter, where modulator/phase-shifter 400 of FIG. 4 is the same as modulator/phase-shifter 340 of FIG. 3.

In the steady state, the modulator/phase-shifter 400 modulates the gain (i.e., output signal from amplitude controller 338) using a carrier signal 402 at the frequency of the resonating mass movement (or velocity). In the steady state, the 90 (or 0) degrees phase shift is directly realized together with the operation of modulation since the phase lock by phase controller 328 guarantees an exact phase relationship between resonating mass movement (or velocity) and any periodical waveform realized in the digital domain 356. In the start-up or transient phase, the carrier signal 402 still cannot replicate exactly the resonating mass movement (or velocity). Thus, in the start-up or transient phase, the 90 (or 0) degrees shift is realized through a combination of: (1) output signal from demodulators 324, (2) an in-phase carrier signal and/or a quadrature carrier signal, and (3) output signal from amplitude controller 338. The combination of these elements allows realization of a modulation with 90 (or 0) degrees phase shift with good approximation even when the sensor unit 302 is out of the steady state.

Referring back to FIG. 3, the output signal of modulator/phase-shifter 340, which is used to generate the driver (or, equivalently forcing) signal 312 of resonant mass 310, is converted into analog format by a digital-to-analogue converter (DAC) 346. Optionally, the output signal of modulator/phase-shifter 340 may be processed by a sigma-delta digital modulator 344 before it is converted by DAC 346. The output signal of DAC 346 may be amplified by a high voltage (HV) amplifier 348, where a charge pump circuit 350 may be optionally used to increase the amplitude of driver signal 312 to thereby increase the magnitude of the actuation force for exciting resonating mass 310. HV amplifier 348 and charge pump circuit 350 may be optionally used, depending on various factors, such as the material property of the springs in sensor unit 302, the voltage level of the power supply (not shown in FIG. 3), the physical size of sensor unit 302, and type of device using sensor unit 302, so on.

It is noted that Signal Conditioning Chain 210 of FIG. 2 refers to a set of components including FE circuit 318, Sample & Hold 320, $\Delta\Sigma$ ADC 322, demodulators 324, and low pass filter 326 of FIG. 3. However, it should be apparent to those of ordinary skill that other suitable components may be included in Signal Conditioning Chain 210. For instance, more than one filter may be used to further reduce noise in the demodulated signal. Also, Signal Conditioning Chain 210 may be implemented by other suitable combination of electrical components.

During the steady state, the frequency of system clock, $f_{vco}$, is an integer multiple of the resonant frequency, $f_o$, of resonating mass 310. However, in non-steady states, such as the start-up stage or transient period caused by an external shock event, the frequency of system clock, $f_{vco}$, is not an integer multiple of the resonant frequency. Thus, the forcing signal derived from the system clock signal has a frequency, $f_i$, that is different from the resonance frequency, $f_0$, where $f_i$ is calculated by the equation $f_i=f_{vco}/N$ and N is an integer number. As discussed above, the response of resonating mass 310 to a driving force is peaked at the resonance frequency. Thus, during non-steady states, the forcing signal may not be driving the resonating mass in the most efficient way. In addition, as discussed above, the system clock signal needs to be locked in phase to the sensor signal for accurate demodulation of the sensor signal. Even though the conventional system might lock the system clock in phase with sensor signal, the conventional system fails to force the correct frequency during non-steady states. Thus, in the conventional system, the measurement of the sensor signal is delayed until the system reaches its steady state. In fact, an error of only a few percent in $f_{vco}$ from its target steady state value may generate a very long start-up time or even make it impossible to start the resonant mass movement. To address this problem, the conventional system may have the factory calibration of $f_{vco}$ and an embedded temperature compensation to enable a proper start-up in each condition, increasing the manufacturing cost and complexity in circuit design.

In contrast, in the present invention, modulator/phase-shifter 340 shifts the phase of driver signal 312 by 90 (or 0) degrees relative to sensor signal 314. As discussed above, during non-steady states, the modulator/phase-shifter 340 combines: (1) output signal from demodulators 324, (2) a quadrature carrier signal and/or an in-phase carrier signal, and (3) output signal from amplitude controller 338. As such, even when the frequency, $f_{vco}$, of system clock signal 336 is off from its target steady state value, controller 316 can effectively drive resonating mass 310. The electro-mechanical closed loop, which refers to the sequence of components disposed along the data flow from sensor signal 314 to driver signal 312, ensures a fast start-up time in the presence of a high percent frequency error of $f_{vco}$ and external shock events.

Typically, the conventional controller is implemented mostly in the analog domain; i.e., the conventional controllers have mostly analog components. Even if some of the conventional controllers include digital components, the implementation of the digital components is not designed to improve the performance in terms of reduction in start-up time, high immunity to process spread, and rejection to external shock events. In contrast, controller 314 includes a closed loop implemented in both analog and digital domains. In FIG. 3, a broken line 352 separates an analog domain 354 from a digital domain 356, where the analog (or digital) domain refers to a section that includes only analog (or digital) components. As depicted, the components in digital domain 356 replace their analog counterparts, reducing complexity in circuit design significantly. Also, the mixed signal solution with high digital content allows product differentiation, important area saving, power saving, test time reduction, noise immunity, manufacturing cost reduction, high profitability, and improved performance.

Figure 5:
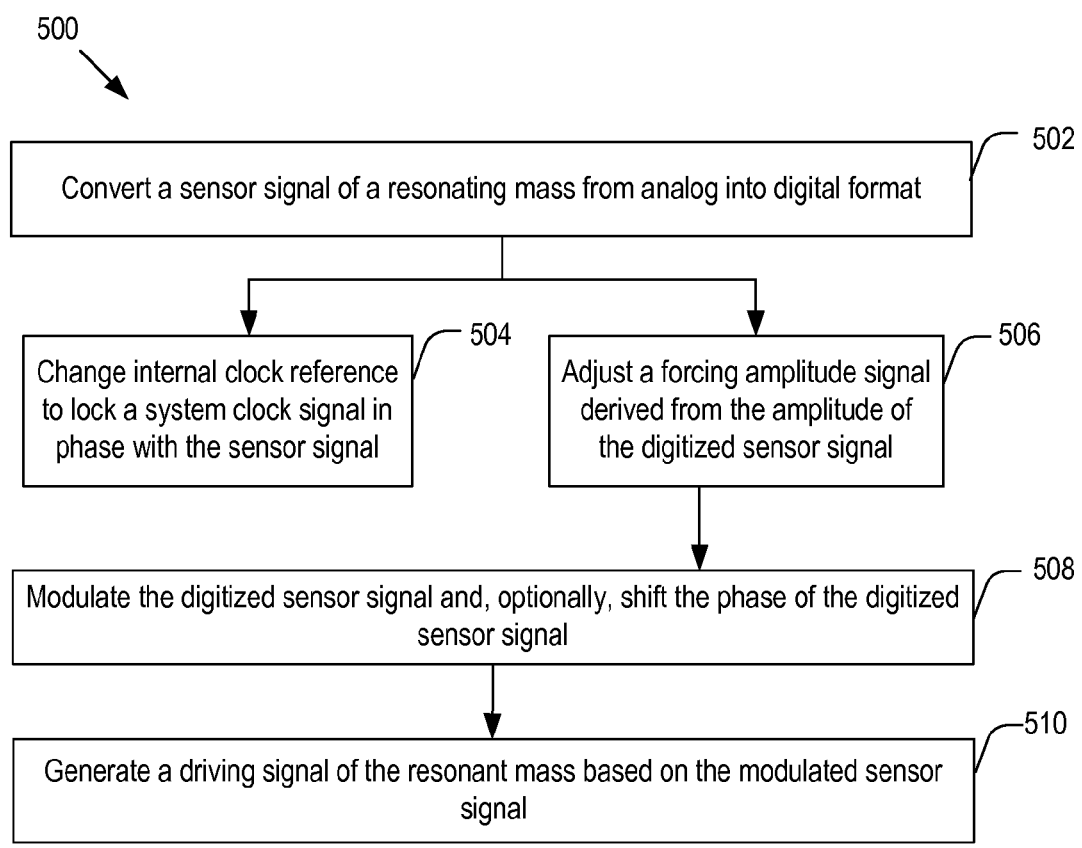
FIG. 5 is a flowchart of an illustrative process for controlling a sensor according to another embodiment of the present invention.

FIG. 5 is a flowchart 500 of an illustrative process for controlling a sensor according to another embodiment of the present invention. The process begins at step 502 by converting sensor signal 314 of resonating mass 310 from analog to digital format, where the sensor signal 314 indicates the displacement or velocity of resonating mass 310. Step 502 may include several steps: converting the capacitance variation (or current variation) of sensor signal 314 into voltage variation by using front-end circuit 318; sampling and holding the voltage variation data by using Sample & Hold 320; converting the sampled and held signal data into digital format by using ΔΣ ADC 322; demodulating the digital signal by using demodulator 324; and filtering the demodulated signal by using low pass filter 326. Then, the process proceeds to a step 504.

At step 504, the internal clock reference is changed to lock the system clock signal 336 in phase with filtered signal. More specifically, the filtered signal is processed by phase controller 328, and the processed signal is used to generate system clock signal 336. Thus, phase controller 328 in effect locks system clock signal 336 in phase with sensor signal 314.

The process proceeds from step 502 to a step 506, too. At step 506, amplitude controller 338 applies a gain to the driving signal in order to bring to zero the difference between current amplitude of the input signal and the target amplitude. Then, at step 508, the signal having adjusted amplitude is modulated by using modulator/phase-shifter 400. Optionally, at step 508, the phase of the modulated signal may be shifted by a predetermined angle. For example, modulator/phase-shifter 400 shifts the phase of the modulated signal by 90 degrees in the case where the sensor signal 314 indicates the displacement of the resonating mass 310 and by 0 degree in the case where the sensor signal 314 indicates the velocity of the resonating mass 310. Then, the process proceeds to a step 510.

At step 510, driving signal 312 of resonant mass 310 is generated using the output signal from phase shifter 406. Step 510 may include several steps: optionally modulating the output signal from phase shifter 406 by using sigma-delta digital modulator 344; converting the modulated signal from digital to analog format by using DAC 346; and amplifying the converted signal by using HV amplifier 348, where HV amplifier 348 outputs driver signal 312. Optionally, charge pump circuit 350 may be used to increase the magnitude of the actuation force of resonating mass 310. Finally, driver signal 312 is input to drivers 306a and 306b via the terminals D1 and D2, to thereby form a closed loop to control the oscillation amplitude of resonating mass 310.

While the invention is susceptible to various modifications and alternative forms, specific examples thereof have been shown in the drawings and are herein described in detail. It should be understood, however, that the invention is not to be limited to the particular forms disclosed, but to the contrary, the invention is to cover all modifications, equivalents, and alternatives falling within the scope of the appended claims.

We claim:

1. A controller for controlling a sensor having a resonating mass, comprising:
    a signal conditioning chain responsive to a sensor signal from the sensor and operative to extract a digitized sensor signal from the sensor signal;
    a frequency/phase controller responsive to the digitized sensor signal and operative to generate a frequency/phase-controlled signal that is locked in phase with the digitized sensor signal;
    an amplitude controller responsive to the digitized sensor signal and operative to generate an amplitude-adjusted signal; and
    a modulator/phase-shifter responsive to the amplitude-adjusted signal and operative to modulate and shift a phase of the amplitude-adjusted signal to thereby generate a modulated signal,
    wherein the resonating mass is configured to be excited based on the modulated signal, to thereby form a closed resonance loop for controlling an oscillation amplitude of the resonating mass.

2. The controller according to claim 1, wherein the signal conditioning chain includes:

an analog-to-digital converter responsive to the sensor signal and operative to convert the sensor signal into a digital signal; and a demodulator responsive to the digital signal and operative to extract the digitized sensor signal, the digitized sensor signal representing an envelope of the oscillation amplitude of the resonating mass and a phase error between the sensor signal and an internal clock reference.

3. The controller according to claim 1, wherein the signal conditioning chain further includes:

a low pass filter responsive to the digitized sensor signal and operative to filter a noise from the digitized sensor signal.

4. The controller according to claim 1, wherein the signal conditioning chain further includes:

a front end circuit responsive to an electrical signal from the sensor and operative to convert the electrical signal into a voltage signal.

5. The controller according to claim 4, wherein the signal conditioning chain further includes:

a sample and hold responsive to the voltage signal and operative to sample data from the voltage signal and hold the data during a set of time period.

6. The controller according to claim 1, further comprising:

a digital-to-analog converter (DAC) responsive to the frequency/phase-controlled signal and operative to convert the frequency/phase-controlled signal into an analog signal.

7. The controller according to claim 6, further comprising:

a sigma-delta digital modulator responsive to the frequency/phase-controlled signal and operative to modulate the frequency/phase-controlled signal before the frequency/phase-controlled signal is input to the DAC.

8. The controller according to claim 1, further comprising:

a digital-to-analog converter (DAC) responsive to the modulated/phase-shifted signal and operative to convert the modulated/phase-shifted signal to an analog signal for driving the resonating mass.

9. The controller according to claim 8, further comprising:

a sigma-delta digital modulator responsive to the modulated/phase-shifted signal and operative to modulate the modulated/phase-shifted signal before the modulated/phase-shifted signal is input to the DAC.

10. The controller according to claim 8, further comprising:

an amplifier responsive to the analog signal and operative to amplify the analog signal.

11. The controller according to claim 8, wherein the sensor signal indicates a displacement of the resonating mass and a phase difference between the analog signal and the sensor signal is 90 degrees.

12. The controller according to claim 8, wherein the sensor signal indicates a velocity of the resonating mass and the analog signal is in phase with the sensor signal.

13. The controller according to claim 1, wherein the sensor is a gyroscope for measuring a rate of rotation of the sensor.

14. A method of controlling a sensor having a resonating mass, comprising:

converting a sensor signal into a digital format to thereby generate a digitized sensor signal, the sensor signal indicating at least one of a displacement and a velocity of the resonating mass;

controlling a frequency and a phase of an internal clock reference to thereby lock a system clock signal in phase to the digitized sensor signal;

adjusting an amplitude of a signal derived from the digitized sensor signal to generate an adjusted amplitude signal;

shifting a phase of the adjusted amplitude signal by a predetermined angle;

modulating the phase-shifted signal; and based on the modulated signal, generating a signal for driving the resonating mass.

15. The method according to claim 14, where the step of converting a sensor signal into a digitized sensor signal includes:

filtering a noise from the digitized sensor signal.

16. The method according to claim 14, wherein the step of generating a signal for driving the resonating mass includes:

converting the modulated signal into an analog signal; and amplifying the analog signal to generate the signal for driving the resonating mass.

17. The method according to claim 14, wherein the sensor is a gyroscope for measuring a rate of rotation of the sensor.

18. The method according to claim 14, wherein the sensor signal indicates the displacement of the resonating mass and the predetermined angle is 90 degrees.

19. The method according to claim 14, wherein the sensor signal indicates the velocity of the resonating mass and the predetermined angle is 0 degree.

* * * * *